United States Patent [19]

Sittig

[11] 3,987,476
[45] Oct. 19, 1976

[54] THYRISTOR
[75] Inventor: Roland Sittig, Nussbaumen, Switzerland
[73] Assignee: BBC Brown Boveri & Company Limited, Baden, Switzerland
[22] Filed: Dec. 5, 1974
[21] Appl. No.: 530,020

[30] Foreign Application Priority Data
Jan. 18, 1974  Switzerland............................ 680/74

[52] U.S. Cl. .................................. 357/30; 357/20; 357/38; 357/86
[51] Int. Cl.² ........................................ H01L 31/00
[58] Field of Search .................. 357/20, 38, 39, 30, 357/86

[56] References Cited
UNITED STATES PATENTS

| | | | |
|---|---|---|---|
| 3,697,833 | 10/1972 | Nakata................................. | 357/38 |
| 3,719,863 | 3/1973 | Ogawa et al. .......................... | 357/38 |
| 3,822,409 | 7/1974 | Abe et al. .............................. | 357/38 |
| 3,832,732 | 8/1974 | Roberts................................. | 357/38 |
| 3,893,153 | 7/1975 | Page et al. ............................. | 357/30 |

FOREIGN PATENTS OR APPLICATIONS

| | | | |
|---|---|---|---|
| 1,091,656 | 11/1967 | United Kingdom...................... | 357/38 |

Primary Examiner—Michael J. Lynch
Assistant Examiner—Joseph E. Clawson, Jr.
Attorney, Agent, or Firm—Oblon, Fisher, Spivak, McClelland & Maier

[57] ABSTRACT

An improved light activated thyristor and a method of fabricating the thyristor are disclosed. The thyristor includes a space charge zone extenable to one end surface of the thyristor body whereby the thyristor may be triggered efficiently with low power light beams. In one embodiment of the device, a notch is formed in an end surface of the thyristor body extending into the space charge region of the forward blocking pn-junction. In another embodiment of the device, a portion of the anodic base region of the thyristor is led up through the cathodic base region to the end surface of the thyristor, whereby the forward blocking junction extends to the end surface of the device.

4 Claims, 3 Drawing Figures

3,987,476

THYRISTOR

BACKGROUND OF THE INVENTION

1. Field of the Invention

The invention relates generally to a thyristor and more particularly to a thyristor which can be switched by an incident light beam. Further, the invention relates to a method of producing such a thyristor.

2. Description of the Prior Art

The firing of high-power thyristors requires considerable external circuitry, expecially for a series connection of several thyritors, as for example in larger converter systems, such as HGUe-rectifiers. It is known how to reduce such circuit requirements by firing the thyristor nonelectrically, e.g. by illumination with a light beam (cf. e.g. U.S. Pat. No. 3,697,833). The known thyristor structures have the disadvantage, however, that the available light energy is not used in the optimum manner. In silicon, moreover the strong absorption at wavelengths below 0.51 microns has a very adverse effect. On the other hand the light energy must be at least 1.11 eV ($\lambda=1.1$ microns) in order to produce electron-hole pairs. The absorption coefficient of silicon, however, becomes greater than $10^4$ cm$^{-1}$ beyond 2.43 eV ($\lambda=0.51$ microns), so that the light only penetrates 1 micron into the semiconductor structure. To increase this value one could of course use infrared light sources of high intensity, e.g. Nd:YAG laser with $\lambda=0.89$ microns. However, the use of such lasers is rather expensive. A further possibility for firing with light, the indirect method in which a light-sensitive, current amplifying element is illuminated, requires a high switching-power consumption according to present conceptions, since the firing current must be obtained from the main circuit while the voltage at the light-sensitive element must be held constant, even if the forward voltage varies over three orders of magnitude.

SUMMARY OF THE INVENTION

Accordingly, it is one object of this invention to provide a thyristor which avoids the disadvantages of prior art devices as pointed out above.

Another object of this invention is to provide a novel thyristor which is easily fired with relatively inexpensive light sources.

Yet another object of this invention is provision of a novel thyristor which is fired without undesirably high external switching power consumption.

A still further object of this invention is the provision of a novel thyristor structure which incorporates a current amplifying element.

Yet another object of this invention is the provisions of a simple method of producing the novel thyristor element disclosed.

Briefly, these and other objects are achieved in accordance with the invention by providing a thyristor having a zone on at least one end surface in which the blocking layer or space charge zone arising before switching with polarity in the switching direction, can appear at the surface, and this region can be acted on by the light beam causing the switching. The advantage of this approach is, among other things, that ordinary light with very slight penetrating power, for example visible light from flash lamps, can be used to fire the thyristor. The light irradiates the space charge zone directly, without creating any new problems with respect to the control of the voltage at this point in spite of the space charge zone occurring at the surface. Thus the light is used very efficiently for increasing the local current density so that the required light output can be kept small. The light is absorbed in the space charge region where the electron-hole pairs can immediately be separated. Light absorption is avoided in field-free regions below the surface or in the neutral base region, where the charge carrier density can be increased only in proportion to the effective lifetime.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
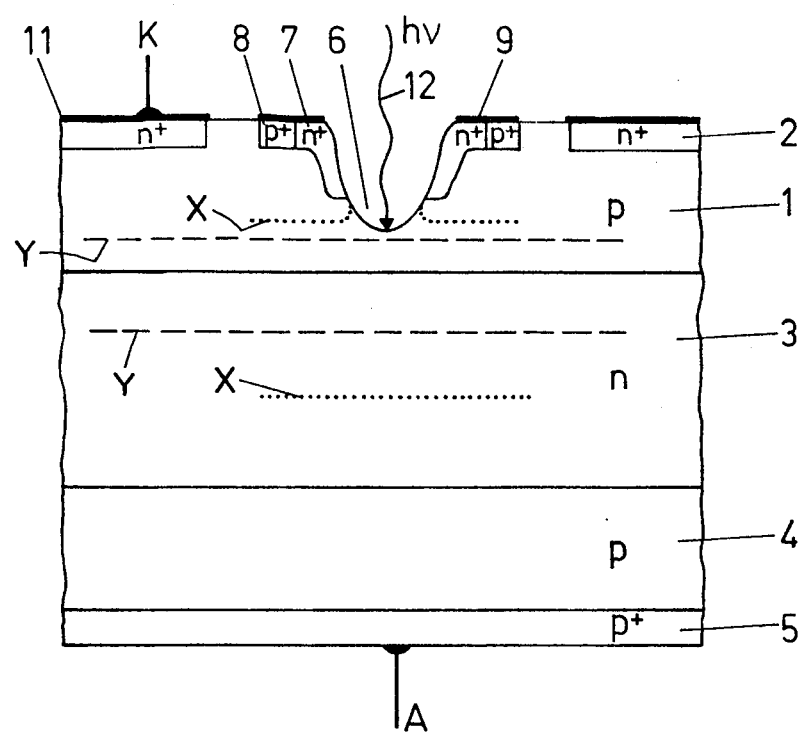
FIG. 1 shows a thyristor structure, viewed from the side, in which light causes firing over a notch in the cathode surface of a reverse blocking thyristor.

Referring now to the drawings, wherein like reference numerals designate identical or corresponding parts throughout the several views, and more particularly to FIG. 1 thereof, a thyristor structure is shown which comprises a cathodic p-base region 1 in which an n$^+$-emitter zone 2 is provided with an attached cathode contact K, an anodic n-base region 3 adjoining the p-base region 1, a p-emitter region 4 as well as a p$^+$-zone 5 with attached anode contact A. There is a notch 6 in the p-base region 1 which extends from the surface of the thyristor structure down into the region of the space charge zone X/Y at the forward blocking pn-junction between the base regions 1 and 3. The notch 6 is surrounded by an n$^+$-zone 7 and an immediately adjoining p$^+$-zone 8, which are bridged over by a common contact 9, so that there results to this extent the known structure of an "Amplifying Gate" (cf. e.g. "Dynamic Problems of Thyristor Technology," VDE Tagung, Aachen September 15/16, 1971, p. 128ff.).

In such a thyristor structure the application of a voltage in the forward direction produces the following current density J:

$$J = \frac{J_i}{1-\gamma_h\beta_h-\gamma_e\beta_e}$$

where: $J_i$ is the generation current (e.g. thermal pair production)

$$\gamma_h, \gamma_e$$

are the efficiencies of the p-n- and n$^+$ p-junctions between zones 4/3 and 2/1 and $$\beta_e, \beta_h$$

are the transport factors for the minority carriers in the neutral regions of zones 1 and 3. Before firing J is the current density of the reverse current. In order for the thyristor to fire the following condition must be satisfied:

$$\gamma_h(J)\beta_h(J) + \gamma_3(J)\beta_r(J) = 1$$

The simplest way to do this is to make use of the dependence of the parameters on the current density by increasing the generation current $J_i$.

This generation current can be very sharply increased by radiation with light. Assuming that a generation current density of 1 A/cm² is necessary for firing, the carrier current density G is then given by:

$$G = \frac{J_i}{q} = 0.62 \times 10^{19} \text{ carriers per cm}^2 \text{ per sec.,}$$

where $q$ = the electrical charge of a carrier.

If now a Nd:YAG laser ($\gamma=1.06\mu$) is used, the absorption coefficient is 28 cm$^{-1}$ for the usual relatively weak doping (N  $10^{17}$ cm$^{-3}$). The absorption factor over a pathlength of 100$\mu$ in the space charge zone is then 0.25. If every absorbed photon produces an electron-hole pair, the power consumption per unit area is 3.4 watt/cm². For an area of 1 mm² the required power is then 34 m watt. This power, however, must be supplied for only a few $\mu$ seconds.

To keep down the loss of light before the space charge zone X/Y is reached, the notch 6 is now provided, reaching to the edge of the space charge zone if necessary. For high forward voltages the space charge zone or blocking layer is bounded by the dotted lines X, for lower ones by the dashed lines Y. The width of the space charge zone affects the required power in that for a small forward voltage the required power increases, since in this case the light must traverse more silicon in order to reach the blocking layer. Consequently the distance between the notch and the blocking layer or space charge zone must be chosen very carefully. Such a thyristor structure is therefore quite critical with respect to the depth of the notch, and its fabrication fraught with great difficulties.

The mentioned difficulties, however, can be completely avoided by the especially preferred structure conforming to the invention which will now be described with the help of FIG. 2. According to FIG. 2 the weakly doped anodic n-base zone 3 is led up in a narrow channel 10 to the surface of the thyristor structure in the region of the cathode K. The channel 10 is of width B and the calculated depth from the cathode surface 11 to the forward blocking pn-junction 13 is L.

At a relatively low forward voltage the space charge zone is bounded by the line Z (broken line) along the pn-junction 13 (represented by a heavy line) between the base zones 1 and 3. In this case a region in the middle of the channel 10 is neutral. If the applied voltage is increased however, the neutral region shrinks and finally the entire channel 10 is emptied of charge carriers. These conditions are indicated in FIG. 2 by the dashed lines Y for a medium forward bias voltage and by X (dotted) for a higher forward bias voltage. The voltage $U_K$ necessary for exhausting the channel depends on the p-profile of the base region 1, the degree of n -doping of the base region 3 and the channel width B. By suitable choice of these parameters a certain operational behavior can be selected for thyristor. If the forward bias voltage is increased still more, there is no further increase of the positive voltage in channel 10 with respect to the cathode or the neutral part of the p-zone 1, so that there is also no further extension of the space charge zone in the neighborhood of the surface or in the p-base region 1. With sufficient depth L of the channel it is accordingly possible to hold the voltage between the neutral p- region and the center of channel 10 at the surfce to a selectable value of the critical voltage $U_K$, even if the forward voltage increases further.

The n$^+$-zone 7 surrounding channel 10 as well as the p$^+$-zone 8 and the common contact 9 serve as an integrated element amplifying the firing current ("Amplifying Gate"). The charge carrier pairs produced directly by the light incident on the space charge region at the end surface 11 are then immediately separated by the ambient field and a firing current is formed which fires the amplifying element 7,8,9 like the usual control electrode current and finally the main thyristor.

To make such a thyristor structure a mask, for example, can be laid over a weakly n-doped substrate, the diameters of the mask being somewhat larger than the channel width B, say B+2L, and a p-diffusion can then be preformed to produce the p-base 1. Known techniques are suitable for doing this. The other portions of the thyristor are also processed by known methods and therefore need not be discussed.

Figure 2:
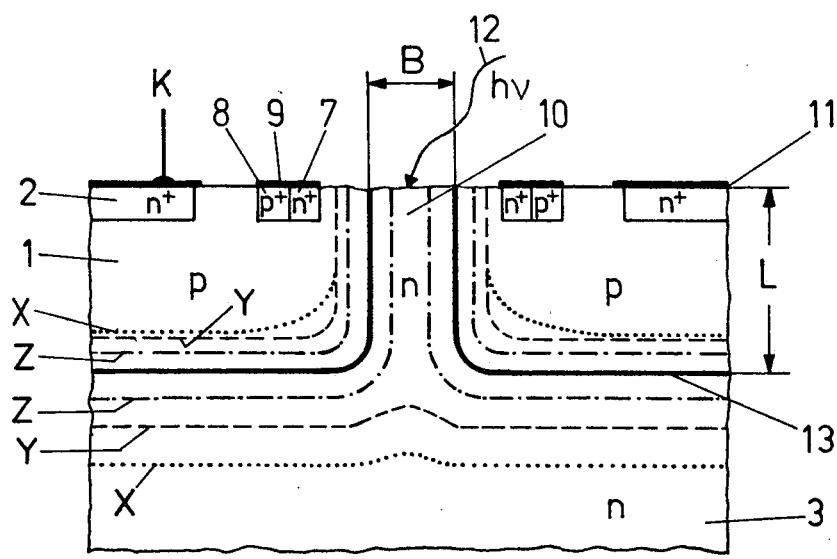
FIG. 2 shows an advantageously modified upper part of a thyristor structure like that in FIG. 1; and, FIG. 3 shows a top view of a thyristor structure with especially favorable geometry of the pn-junction occurring on the end surface.

In preparing an element like that of FIG. 2 the following exemplary dimensions may be used. If one starts with a commercial thyristor in which the metallurgic, forward blocking pn-junction (13 in FIG. 2) lies 95$\mu$ beneath the cathodic end surface 11 of the thyristor after a deep aluminum diffusion in an n-substrate, then the channel depth is $L=95\mu$. For the thyristor the surface doping is then, for example, $N_A = 1.5 \times 10^{16}$ cm$^{-3}$ in the cathodic base region 1 and the n-base doping of the anodic base region 3 is $N_D = 6.5 \times 10^{13}$ cm$^{-3}$.

The shape of the doping profile of base region 1 is approximately $N(Z)=N_A$ erfc $(Z/Z_o)$, where $Z$ is the distance into the thyristor from the end surface 11 and $Z_o = 47$. For such a pn-junction the (avalanche) breakdown voltage is about $U=2700$ volts. At this voltage the blocking layer or space charge zone extends 35$\mu$ into the p-zone 1, and 200$\mu$ into the n-zone 3. The width B of the channel is essentially determined by the premissible potential difference $U_K$ on the thyristor surface 11 between the center of the channel 10 and the p-zone 1. If, for example $U_K$ = 190 V is specified, giving a 50$\mu$ thick blocking layer in the n-region of zone 3, then the corresponding channel width is $B=2\times50\mu=100\mu$. For voltages greater than $U_K$ between the anode A and the cathode K, the potential advantageously is not altered any further, as already pointed out.

In practice, the minimum anode-cathode voltage $U_Z$ at which the thyristor can still be fired is also important. Experiments show that firing of the structure just described is still quite possible at $U_Z$ = 30 volts. This is explained by the fact that the recombination of charge carriers at the surface, which reduces the firing current produced by radiation with light, plays practically no role for the proposed structure. Since the transport factor is not important in this device, then the recombination of charge carriers inside the device does not reduce the firing current. A firing current of $I_Z$ = 100 mA can be required to fire the thyristor, for example.

The number of charge carrier pairs effecting the firing is proportional to the area $F = b \times l$ of the blocking layer or space charge zone made with the surface 11 of the thyristor. At $U_Z$ = 30 volts the width of the blocking layer at pn-junction 13 is $b = 12.5\mu + 21.5\mu = 34\mu$ (12.5$\mu$ is the depth of penetration into the p-zone 1 and 21.5$\mu$ that into n-zone 3.). In order to make F as large as possible, therefore, the length $l$ of the line along which the pn-junction 13 cuts the end surface 11 of the thyristor is made as large as possible.

Figure 3:
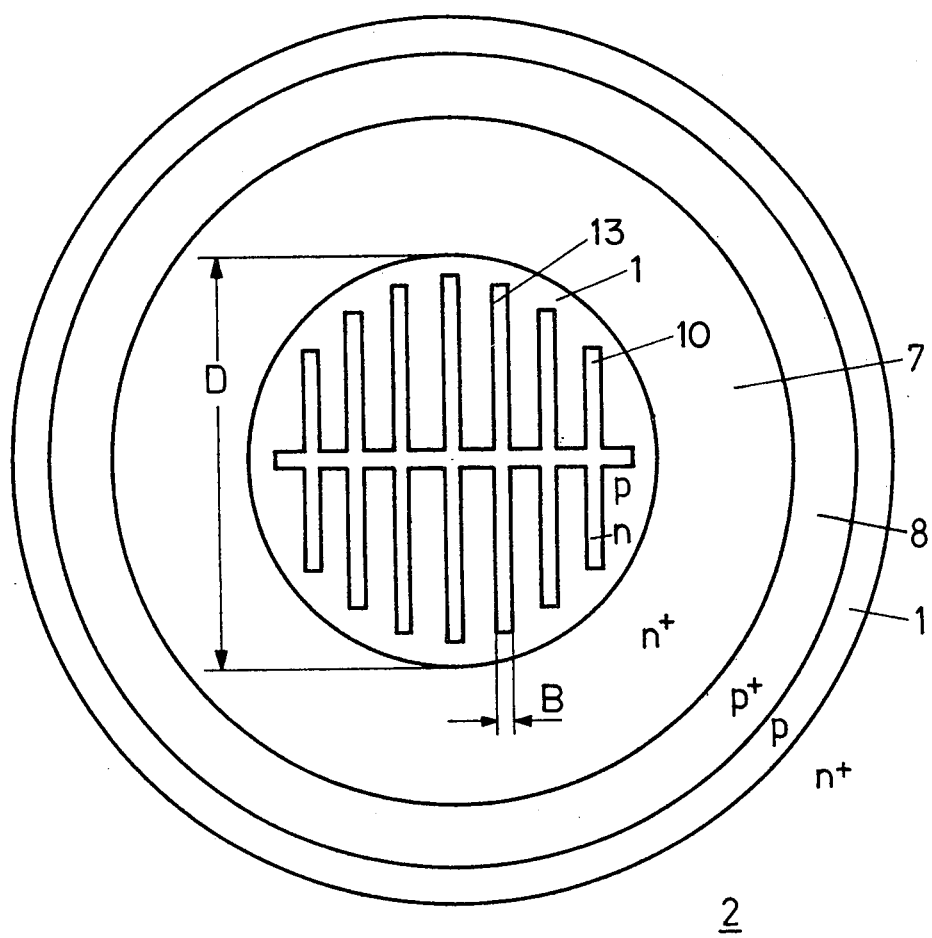

A suitable approach for this is, for example, the comb structure shown in FIG. 3 for the surface encounters of n-zone 3 or 10. In this configuration with $B = 100\mu$, the length of the pn-junction 13 is $l$=36 mm, with the comb structure kept inside a circle of diameter $D$= 3 mm. The area F of the blocking layer then amounts to about 1/6 of the circular area of 0.07 cm$^2$.

For a configuration like this, the portion of the light source serving to fire the thyristor, which is focused on the area F, must emit about 2.5 × 10$^{19}$ photons per second with an energy > 1.1 eV. That means for a thermal light source, e.g. a tungsten wire, required output of about 16 W (continuous), which however must naturally be available only as a light flash of 10 – 100$\mu$ sec. duration. A more suitable light source for this is an arc lamp.

It should be pointed out that there are, of course, still favorable geometries possible other than that shown in FIG. 3. In particular, the region 10 in which the n - doping of the base zone 3 extends to the surface need by no means be continuous.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light activated thyristor comprising:
   a semiconductor body having at least one end surface,
   a pn-junction for blocking in the switching direction, said pn-junction extending to a region of said one end surface,
   means for permitting said thyristor to be activated by a light beam, said permitting means including a space charge zone at said pn-junction in said semiconductor body extendable to said region of said one end surface upon application of a voltage across said thyristor,
   an anodic base region, and
   a cathodic base region, said pn-junction formed between said anodic and cathodic base regions,
   said anodic base region extending to said one end surface of said thyristor in at least one channel passing through said cathodic base region, whereby said pn-junction reaches to said one end surface, and
   wherein the space charge zone of said pn-junction penetrates a predetermined distance into said anodic base region when a forward bias voltage less than the avalanche break down voltage of said pn-junction is applied to said thyristor,
   said channel has a diameter equal to twice said predetermined distance, and
   said channel has a depth equal to the depth of said pn-junction within said thyristor.

2. A thyristor as in claim 1, wherein:
   said pn-junction has a geometrical configuration selected to maximize the length thereof reaching said one end surface.

3. A thyristor as in claim 2, wherein:
   said anodic base region extends to said one end surface in a comb pattern.

4. A thyristor as in claim 1, further comprising:
   a highly n-doped annular region surrounding said channel at said one end surface,
   a highly p-doped annular region surrounding said channel at said one end surface, and adjoining said highly n-doped region; and contact means at said one end surface electrically connecting said annular regions.

* * * * *